(12) United States Patent
Weber et al.

(10) Patent No.: US 7,303,961 B2
(45) Date of Patent: Dec. 4, 2007

(54) METHOD FOR PRODUCING A JUNCTION REGION BETWEEN A TRENCH AND A SEMICONDUCTOR ZONE SURROUNDING THE TRENCH

(75) Inventors: Hans Weber, Ainring (DE); Gerhard Silvester Neugschwandtner, Langenstein (AT); Martin Poelzl, Ossiach (AT)

(73) Assignee: Infineon Technologies AG, Munich (DE)

( * ) Notice: Subject to any disclaimer, the term of this patent is extended or adjusted under 35 U.S.C. 154(b) by 265 days.

(21) Appl. No.: 11/027,496

(22) Filed: Dec. 30, 2004

(65) Prior Publication Data
US 2005/0242370 A1    Nov. 3, 2005

(30) Foreign Application Priority Data
Dec. 30, 2003    (DE) ............................ 103 61 715

(51) Int. Cl.
H01L 21/336    (2006.01)

(52) U.S. Cl. .................. 438/272; 438/425; 438/431; 438/432; 257/330; 257/401; 257/E29.262

(58) Field of Classification Search ................ 438/272
See application file for complete search history.

(56) References Cited

U.S. PATENT DOCUMENTS

| 5,082,795 | A | 1/1992 | Temple |
| 5,126,807 | A | 6/1992 | Baba et al. |
| 6,232,171 | B1 | 5/2001 | Mei |
| 2003/0216044 | A1 | 11/2003 | Lin et al. |

FOREIGN PATENT DOCUMENTS

EP    1 168 455 A2    1/2002

*Primary Examiner*—Tu-Tu Ho
(74) *Attorney, Agent, or Firm*—Maginot, Moore & Beck

(57) ABSTRACT

A method for producing a junction region (2, 5, 6, 7) between a trench (3) and a semiconductor zone (2) surrounding the trench (3) in a trench semiconductor device (1) has the following steps: application of an oxidation barrier layer (15) to an upper part (O) of the inner walls of the trench (3), and production of a first oxide layer (7) on a lower part (U) of the inner walls, said lower part not being covered by the oxidation barrier layer (15), by means of thermal oxidation of the uncovered (U) part of the inner walls.

19 Claims, 5 Drawing Sheets

PRIOR ART

METHOD FOR PRODUCING A JUNCTION REGION BETWEEN A TRENCH AND A SEMICONDUCTOR ZONE SURROUNDING THE TRENCH

FIELD OF THE INVENTION

The invention relates to a method for producing a junction region between a trench and a semiconductor zone surrounding the trench.

BACKGROUND

Semiconductor devices can be constructed vertically or laterally. Compared with lateral semiconductor devices, vertical semiconductor devices have an increased integration density with regard to the semiconductor device surface area. Transistor semiconductor devices with a vertical construction are usually designed as trench semiconductor devices. The construction of a vertical power transistor realized as a trench semiconductor device will be explained in more detail below with reference to FIG. 1.

FIG. 1 shows a detail from a transistor 1 formed in a semiconductor zone 2. A plurality of trenches 3 are provided in the semiconductor zone 2, a field plate 4, a gate electrode 5, a gate oxide layer 6 and also a field oxide layer 7 being provided in each case within the trenches 3. The semiconductor zone 2 has a plurality of source zones 8 body zones 9 and also drain or drift zones 10. The source and body zones 8, 9 are electrically connected to a metallization layer 12 via a poly plug 11. The gate electrodes 5 are electrically insulated from the metallization layer 12 by an insulation structure 13.

Although the transistor 1 shown in FIG. 1 is constructed vertically and thus has an increased integration density relative to a transistor with a lateral construction, a width B of the trenches 3 on the top side of the transistor 1 is considerable, which means that the percentage proportion of the semiconductor device surface area required by the trenches 3 is not negligible. The width B of the trenches 3 cannot be reduced arbitrarily, however, since a relatively thick oxide layer, the field oxide layer 7, and optionally an additional field electrode is required in the lower region of the trenches 3 for the reliable functioning of the transistor 1. The width B of the trenches 3 thus depends on the thickness of the field oxide layer 7: the thicker the field oxide layer 7, the greater the width B of the trenches 3 must be as well.

The object on which the invention is based is to provide a method by which the width of the trenches in semiconductor devices with a vertical construction can be reduced, and, at the same time, the thickness of the field oxide layer provided in the trenches can be retained.

SUMMARY

The method according to the invention for forming a junction region between a trench and a semiconductor zone surrounding the trench (i.e. for forming the trench/semiconductor zone interface) has the following steps:

application of an oxidation barrier layer to an upper part of the inner walls of the trench, and production of a first oxide layer on a lower part of the inner walls, said lower part not being covered by the oxidation barrier layer, by means of thermal oxidation of the uncovered part of the inner walls.

The term "semiconductor zone" is to be understood to mean, in particular, a substrate, one or a plurality of semiconductor layers formed on/in the substrate, or a combination of substrate and semiconductor layers applied thereto/formed therein. The term "junction region" encompasses, in particular, that part of the semiconductor zone which adjoins the trenches or the oxide layers formed therein, the oxide layers (gate oxide, field oxide) and also further layers applied on the oxide layers, for example gate electrode layers.

The method according to the invention enables the targeted widening of trenches in the lower region whilst at the same time effecting oxide layer production. The widening of the trenches that is obtained by the widening process serves for receiving the field oxide layer that is produced by oxidation during the widening process. By virtue of the "swapping"—thus effected—of the field oxide layer into the adjacent semiconductor zone surrounding the trench, it is possible to produce trenches with very small dimensions in the upper trench region without having to dispense with a thick oxide layer in the lower region of the trenches.

In order to promote the widening effect, before the production of the first oxide layer (field oxide layer), the lower part of the inner walls of the trench, said lower part not being covered by the oxidation barrier layer, may be subjected to an etching process. Thus, a bulge is already present in the lower region of the trenches before the beginning of the oxidation process, which bulge is additionally enlarged by the oxidation process. Consequently, through a corresponding choice of etching steps, it is possible to control whether the field oxide produced by the subsequent oxidation process is located completely in the bulge, or whether the field oxide projects at least partly into the trench.

The method according to the invention can be applied to any desired trench semiconductor devices. The trench semiconductor device is preferably a transistor. In this case, body zones are to be produced by corresponding doping processes in the semiconductor zone surrounding the trench. The body zones may in this case be formed before or after the production of the field oxide layer.

The body zones are preferably produced before the formation of the field oxide layer in the semiconductor zone since this permits a mutual passive alignment of field oxide layer and body zone. In order to enable the abovementioned passive alignment of body zone and field oxide layer, the oxidation barrier layer should be applied such that the vertical position of the lower end of the oxidation barrier layer is situated above the vertical position of a junction between the body zone and the underlying part of the semiconductor zone. Through the oxidation process, the dopant (particularly if boron is used as doping material) that accumulates in the oxide layer produced by the oxidation process is withdrawn from the uncovered part of the body zone by means of the so-called pile-up effect. What can thus be achieved is that the upper end of the oxide layer directly adjoins the lower end of the body zone (as a result, the body/field oxide overlap is self-aligning and the gate-drain capacitance is minimized), whereby it is possible to realize a transistor with extremely short switching times.

Preferably, a second oxide layer (gate oxide layer) and a conductor layer are provided between the oxidation barrier layer and that part of the inner walls of the trench which is opposite to the latter, the second oxide layer, the conductor layer and the oxidation barrier layer being applied in this order on the upper part of the inner walls of the trench. The gate oxide layer then forms, together with the field oxide layer, a common, contiguous oxide layer having a small layer thickness (gate oxide layer) in the upper region and an increased layer thickness (field oxide layer) in the lower region. The gate oxide layer may in this case be produced by a deposition process or an oxidation process. The deposition of the layers is effected before the oxidation process in the lower part of the trench.

The oxidation barrier layer may be produced as follows: firstly, the trench is filled with a filling material that can be etched selectively with respect to the material of the semiconductor zone (for example silicon) and the material of the oxidation barrier layer. The filling material is then etched back down to a vertical position corresponding to the later vertical position of the lower end of the oxidation barrier layer. The oxidation barrier layer is then applied to the inner walls or to layers applied thereto and the bottom of the trench, said bottom being formed by the top side of the filling material. That part of the oxidation barrier layer which bears on the filling material is then removed by means of an anisotropic etching process, after which the filling material can be removed by means of a selective etching process.

As already mentioned, the method according to the invention is preferably suitable for trench semiconductor devices having field plates in the lower region of the trenches. The field plates are in this case introduced into the trenches after the formation of the field oxide layer, so that the field oxide layer at least partly encloses the trenches.

The invention furthermore provides a trench semiconductor device. The lower parts of the trenches of the semiconductor device are widened relative to the upper parts of the trenches, a first oxide layer (field oxide layer) being incorporated in each case into the widened portions of the trenches. Preferably, field plates are provided in the trenches, said field plates being at least partly enclosed by the first oxide layer.

The trench semiconductor device may be a power semiconductor device, for example.

BRIEF DESCRIPTION OF THE DRAWINGS

The invention is explained in more detail below in exemplary embodiment with reference to the figures, in which.

DETAILED DESCRIPTION

Figure 1:
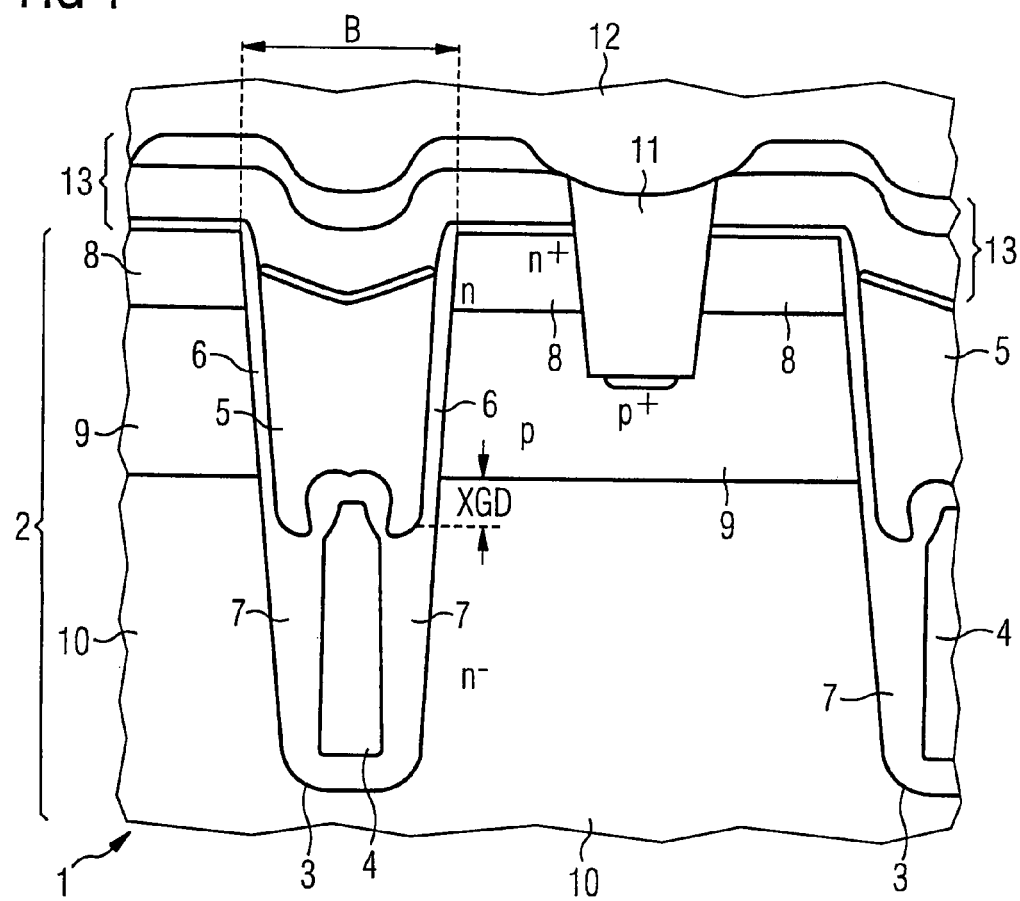
FIG. 1 shows a detail from a power semiconductor transistor with a vertical construction in accordance with the prior art.

In the figures, identical or mutually corresponding structural parts or structural part groups are identified by the same reference numerals.

Figure 2:
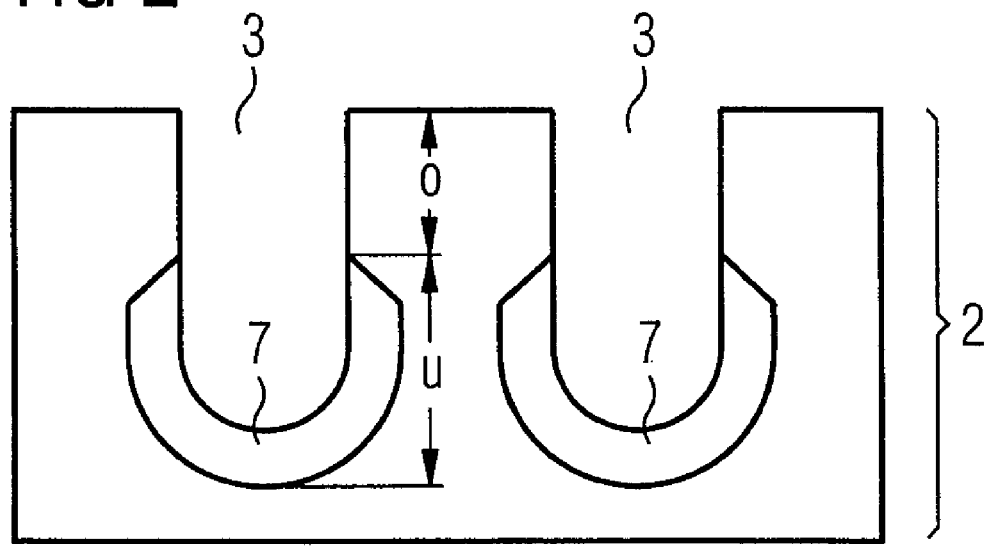
FIG. 2 shows a cross-sectional illustration of a detail from a first embodiment of a trench semiconductor device according to the invention.
Figure 3:
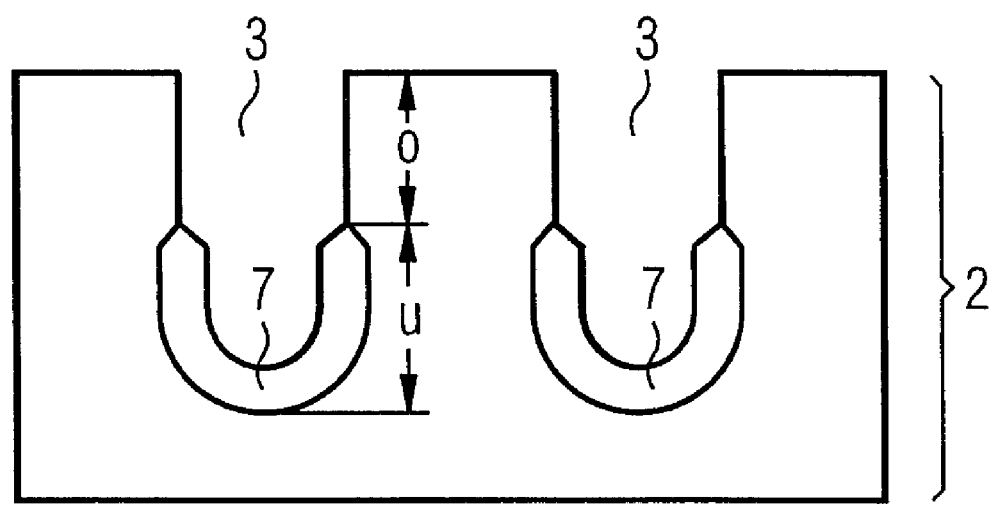
FIG. 3 shows a cross-sectional illustration of a detail from a second embodiment of a trench semiconductor device according to the invention.

A detail from a trench semiconductor device according to the invention is reproduced in greatly simplified fashion in FIG. 2: a plurality of trenches 3 that are widened in a lower region U are provided in a semiconductor zone 2, for example a silicon substrate or a combination of substrate and epitaxial layers applied thereto. Field oxide layers 7, which are preferably obtained by thermal oxidation of a part of the semiconductor zone 2, are incorporated into the widened portions. In FIG. 2, the inner walls of the trenches 3 terminate flush with the inner sides of the field oxide layers 7. In FIG. 3, by contrast, the inner sides of the field oxide layers 7 project into the trenches 3. The extent to which the field oxide layers 7 project into the trenches 3 may be controlled by means of an etching process of the semiconductor zone 2 in the lower region U of the trenches 3 (isotropic etching process) before carrying out the oxidation process.

Figure 4A:
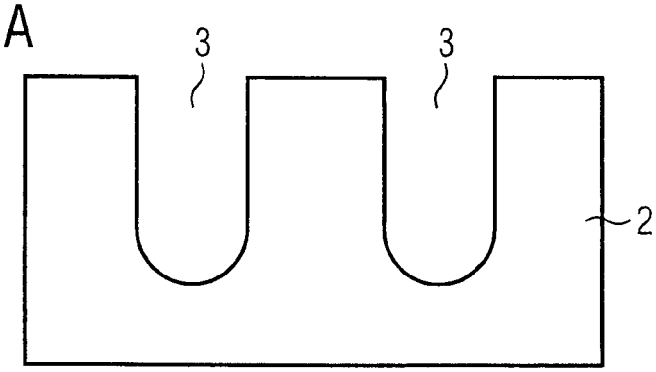
FIGS. 4a to 4b show a first to fourth process step of a preferred embodiment of the method according to the invention for fabricating the trench semiconductor device shown in FIG. 3.
Figure 4B:
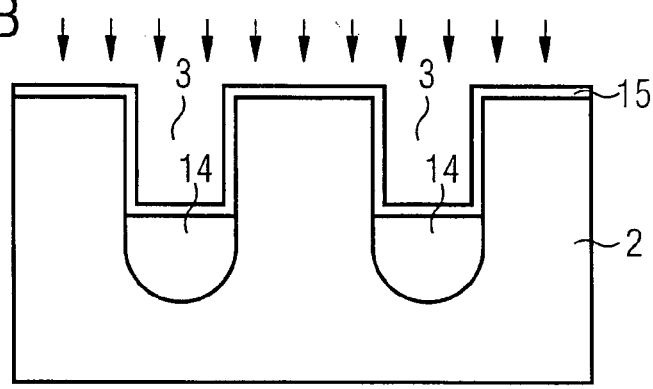
Figure 4C:
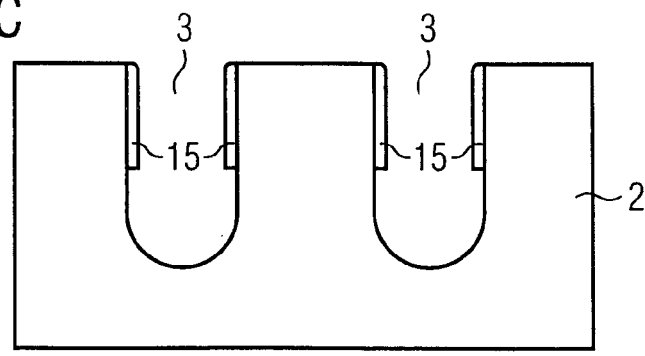
Figure 4D:
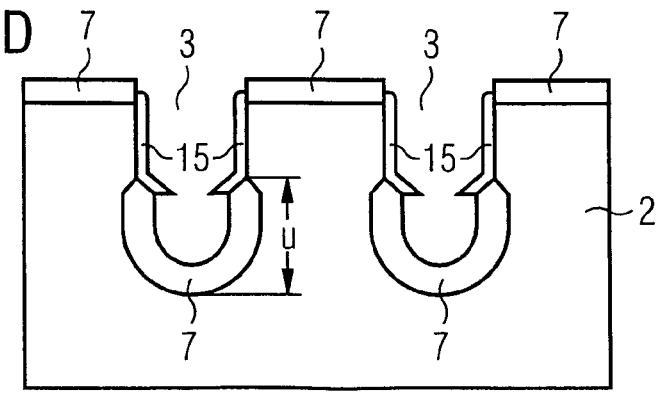

One possible process for fabricating the trench semiconductor devices shown in FIGS. 2 and 3 will now be explained with reference to FIGS. 4a to 4d. In a first process step, trenches 3 are produced in a semiconductor zone 2, for example by means of an etching process (FIG. 4a). The trenches 3 are then partly filled with a filling material 14, or are completely filled and it is partly removed again by means of an etching-back process. An oxidation barrier layer 15 is applied to the inner walls of the trenches 3 and to the top side of the filling material 14 (4b). That part of the oxidation barrier layer 15 which bears on the filling material 14 is removed by means of an anisotropic etching process. The filling material 14 is subsequently removed by means of a selective etching process (4c). A thermal oxidation process is then carried out, which converts the uncovered parts of the trench inner walls, i.e. the parts of the trench inner walls not covered by the oxidation barrier layer 15, into oxide, field oxide layers 7 thereby arising in the lower region U of the trenches 3. No oxidation is effected below the oxidation barrier layer 15.

Body zones have not yet been provided in the semiconductor zone 2 shown in FIGS. 4a to 4d. Said body zones may be produced after the formation of the field oxide layers 7 by removal of the oxidation barrier layers 15 and subsequent doping processes in the semiconductor zone 2 (insofar as the trench semiconductor device is intended to be used as a transistor).

Figure 5A:
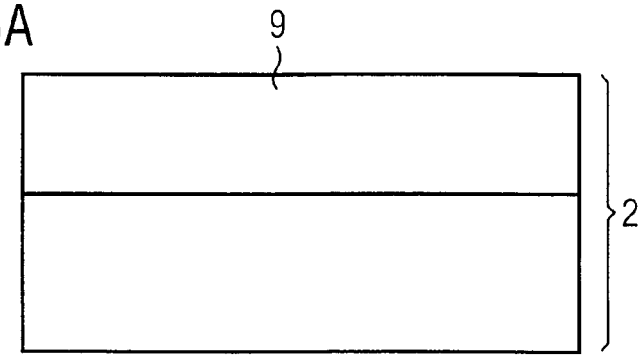
FIGS. 5a to 5d show a first to fourth process step of a preferred embodiment of the method according to the invention, which includes a mutual alignment of field oxide layer and body zone.
Figure 5B:
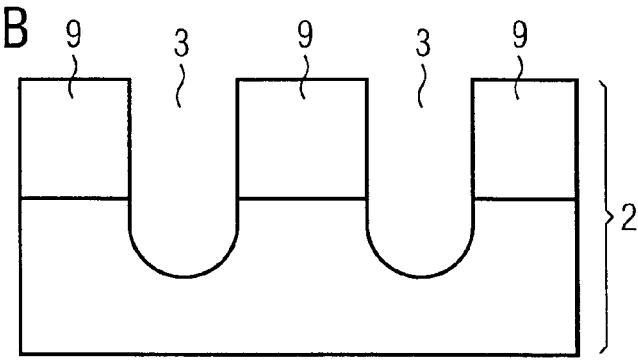
Figure 5C:
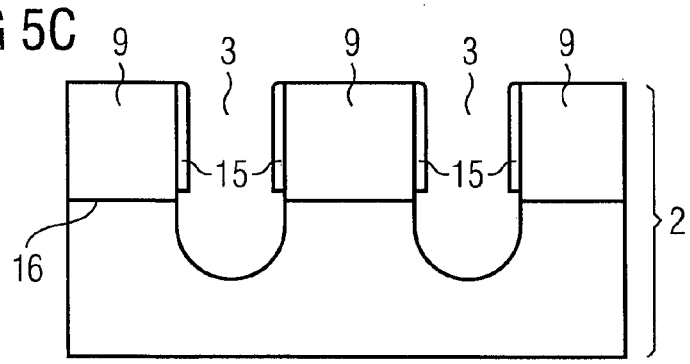

As an alternative to this, it is possible, as shown in FIGS. 5a to 5d, firstly to form body zones 9 in the semiconductor zone 2 and subsequently to produce the trenches 3 (FIGS. 5a, 5b). Afterward, in a manner analogous to that shown in FIGS. 4b and 4c, it is possible to form an oxidation barrier layer 15 (FIG. 5c), the lower end of the oxidation barrier layer 15 being located above the vertical position of a junction 16 between the body zones 9 and the underlying part of the semiconductor zone 2. The field oxide layer 7 is subsequently produced by means of a thermal oxidation process. During this oxidation process, doping material is withdrawn from the body zones 9 by means of the pile-up effect and accumulated in the oxide layer 7, thereby shortening the vertical extent of the body zones 9 at the edge of the inner walls of the trenches 3. This effect at the same time brings about a mutual alignment of the lower end of the body zones 9 and of the upper end of the field oxide layer 7 ("field plate base point"). The distance between the field plate base point and the lower end of the body zones 9, said distance being shown in FIG. 1 and designated by "XGD", can thus be caused to disappear. In this way, it is possible to produce a trench semiconductor device having extremely short switching times.

In FIGS. 5a to 5d, the oxidation barrier layer 15 has been applied directly to the inner walls of the trenches 3. After the formation of the field oxide layers 7, the oxidation barrier layer 15 can then be removed and a gate oxide layer can be deposited or grown on the trench inner walls thus uncovered. As an alternative to this, it is possible, as shown in FIGS. 6a to 6c, to apply a gate oxide layer 6 and a gate electrode 5 between the oxidation barrier layer 15 and the body zones (FIG. 6b). The semiconductor device shown in FIG. 6c is then present after corresponding selective etching processes, in which semiconductor device the field oxide layers 7 may subsequently be produced in the lower region of the trenches 3 by means of thermal oxidation processes.

Figure 5D:
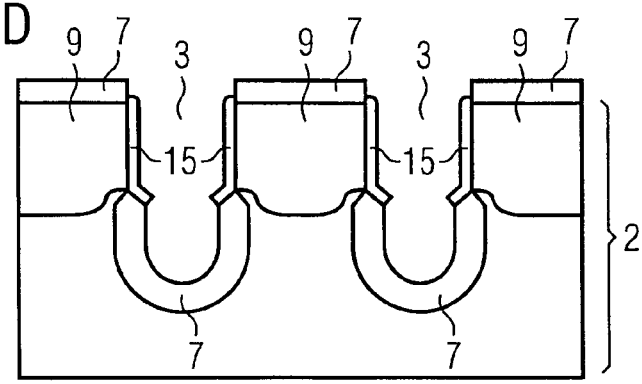
Figure 6A:
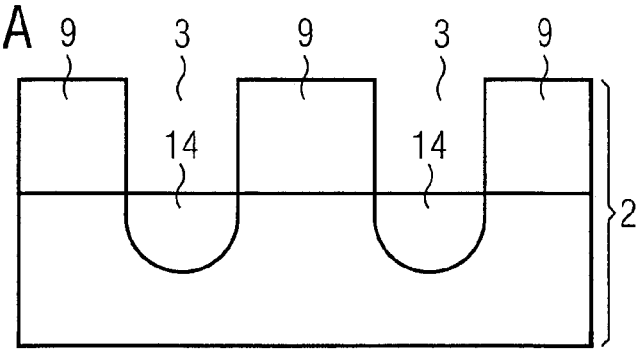
FIGS. 6a to 6c show a first to third process step of an alternative embodiment of the method according to the invention with respect to the embodiment shown in FIGS. 5a to 5c.
Figure 6B:
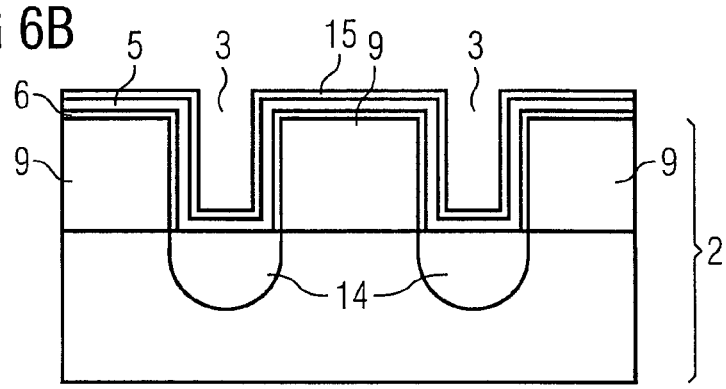
Figure 6C:
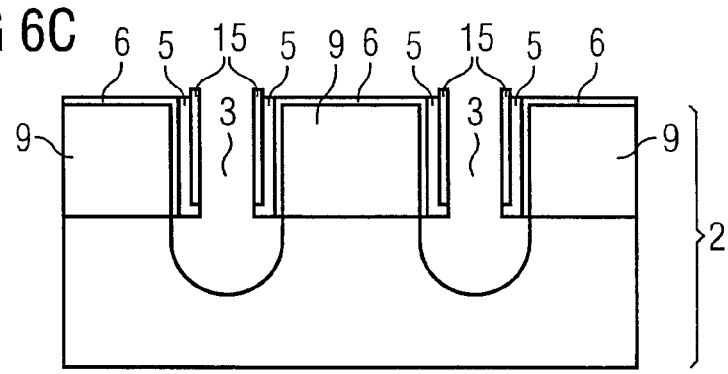
Figure 7:
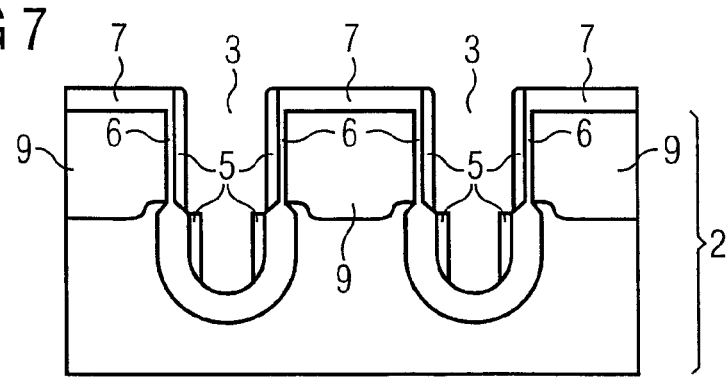
FIG. 7 shows a trench semiconductor device according to the invention which has been fabricated in accordance with an embodiment of the method according to the invention.

FIG. 7 shows a process stage that follows the process stage shown in FIG. 5d. Here, the oxidation barrier layers 15 shown in FIG. 5d have been removed and a gate oxide 6 has been grown or deposited. A gate electrode 5 has subsequently been deposited on the gate oxide layer 6.

Further details of the invention will be explained below.

Older generations of MOS field effect transistors were usually designed as lateral devices. More modern devices, by contrast, are usually designed in accordance with the trench concept. In this case, the channel runs perpendicular to the chip surface, as a result of which the packing density is increased correspondingly with respect to lateral transistors and the productivity, measured on the silicon area, is increased. Accordingly, in the case of trench technologies, limiting factors for area utilization are not the dimensions of the channel but rather generally the structures that remain superficially on the mesa, such as the electrode contacts (contact holes).

On the other hand, the trench also takes up a non-negligible area that is essentially determined by structures in the trench. In order to illustrate this, an example will briefly be discussed:

FIG. 1 shows the vertical structure of a transistor cell in cross section; what are characteristic of this component are, for example, a relatively thick oxide structure (first oxide layer, "field oxide") in the lower part of the trench and a laterally adjoining poly layer that acts as a field plate ("field plate concept"). The equipotential lines are for the most part guided in the oxide structure, i.e. it contributes significantly to the voltage decrease between the source on the front side of the chip and the drain on the rear side (said field oxide is adjoined upwardly by the significantly thinner gate oxide which, toward one side, is covered by the gate electrode made of polysilicon). Accordingly, the width of the trench is crucially determined by the thick field oxide.

The invention is intended to specify a design and the associated fabrication method by means of which the trench width of a transistor described above can be minimized despite using a thick field oxide. The mesa area and also the electrical performance are intended to remain unaffected by this.

The invention makes it possible to "trim" devices to extremely short switching intervals, for which a gate/drain capacitance that is as small as possible is indispensable (aim: reduction/elimination of the Miller plateau). Said capacitance is principally determined by XGD (XGD=distance between lower edge of the p-doped body/channel zone and the field plate base point) (by contrast, the source/drain capacitance plays a secondary part in the switching speed, for which reason the lower polyelectrode is expediently put at source potential). Thus, XGD must be minimized for optimum functioning. Possible methods in this respect will be described below.

The principle aim is the reduction of the trench width (which must be referred to as inactive relative to the on resistance), the intention being nevertheless to continue to use a thick field oxide in the lower part of the trench.

In the case of previously known devices, the Si (silicon) trench wall runs in planar fashion to the greatest possible extent in the finished processed cell. According to the invention, the trench in silicon is widened downwardly, beginning with the field plate base point. The field oxide is intended to be placed into this "bulge".

One example is given in FIG. 2. This means that, unlike previously, the field oxide no longer projects into the trench, that is to say it is no longer necessary to keep trench width for this. Moreover, now the lateral extent of the field oxide is "made available" as it were by the Si mesa. Seen from above, the mesa does not have to be widened for this measure, however, because the width is still determined principally by diverse structures positioned superficially, e.g. the contact hole, and not by the proposed modification of the trench form, said modification lying deep in the Si bulk. In the case of previously known devices, the relatively large width of the mesa in deeper shafts is not utilized or is utilized only poorly. The "mesa" is understood here to mean, in particular, the semiconductor zones situated between the trenches.

In terms of production technology, the measure proposed may be implemented e.g. by means of diverse variants of a LOCOS process in the trench. This presupposes, then, that the field oxide is fabricated by thermal oxidation.

A "traditional" LOCOS process results in a cell as illustrated in FIG. 3. In this case, the entire field oxide does not lie recessed in the "trench bulge", rather approximately half of the oxide thickness still projects into the trench. This cell therefore represents as it were a precursor of the variant of FIG. 2 exhibiting maximum area optimization. A possible production sequence for the "traditional" LOCOS process in the trench shall be briefly outlined (FIGS. 4a-4d):

The aim is to prepare the etched trench (hitherto still planar trench wall) such that no thermal oxide growth takes place in the upper region, while the field oxide is formed, however, outside this region. Silicon nitride functions as an oxidation barrier in the upper trench region.

After trench etching, firstly the trench is completely filled with a material (e.g. oxide) that can be etched selectively with respect to silicon and the barrier material, silicon nitride, applied later. Afterward, this filling is etched back down to the depth below the mesa level where the lower edge of the oxidation barrier is later intended to lie. The deposition of the barrier material and an anisotropic etching then follow, as a result of which a silicon nitride spacer is formed. Finally, the filling that remained in the lower trench region is completely removed by etching selectively with respect to the spacer and with respect to silicon. The thermal oxidation leading to the field oxide in a localized manner onto the lower trench region can then take place.

Only the main steps are reproduced in this production sequence. Any desired variations are conceivable, however. In particular, the gate oxide may be grown as early as before the LOCOS process.

In order to achieve a process result as shown in FIG. 3 (variant exhibiting maximum area optimization), it is possible, e.g. after the nitride spacer etching and still before the actual oxidation step, for Si to be etched back isotropically selectively with respect to $Si_3N_4$ (as it were with the spacer as a mask). Thus, in this variant, the trench wall "bulge" into which the field oxide is intended to be placed is already preformed and not prescribed solely by the locally selective oxidation process.

It would also be conceivable to achieve this preforming by means of a first oxidation instead of with the Si etching-back outlined, the resulting oxide again being completely removed.

One example: with the optimized variant, the area requirement of a transistor could be reduced by about 20%.

The utilization of the LOCOS process set forth above results in further advantageous applications that will be presented below:

The aim is to utilize the LOCOS process for a trench transistor with a double polyconcept in such a way that the position of the field plate base point (of the gate electrode) is coupled (self-aligned) to the body zone in a defined manner. As a result, the distance XGD can be minimized and the switching speed can be increased (independently of production fluctuations) without influencing the channel activation.

The idea essentially consists in firstly forming the body zone of the trench device and then shortening said body zone in the channel region in a manner coupled to the fabrication of the field oxide in "self-aligned" fashion to an extent such that the lower end is coupled to the field oxide base point (e.g. coincides identically with the latter).

The gate electrode may be fabricated in different ways once again in a self-aligned manner with respect to the position of the field oxide.

The realization of the idea utilizes the property of some doping elements (e.g. boron) of accumulating in the oxide layer during a thermal oxidation ("pile-up" in the oxide). Beneath the oxide formed, the remaining silicon is then depleted of this doping. By contrast, other elements (e.g. phosphorus) exhibit the opposite effect; they are incorporated into the oxide to an underproportionally great extent and therefore accumulate in the silicon (pile-down in the oxide). By virtue of this effect, it is possible to alter the doping equilibrium in the silicon at the same time as the fabrication of the field oxide.

The fabrication chain will now be described in detail (FIGS. 5a-5d) (the following explanations relate to an n-channel device but they can also be applied analogously to other components):

A. According to the invention, the body is already defined before the fabrication of the field oxide. Doping atoms that exhibit an accumulation in the oxide (pile-up) during an oxidation are suitably used to form the body/channel. The element that is probably the most customary for this purpose is boron.

B. The upper part of the trench wall then has to be prepared such that in this region, which prescribes the later channel, no growth takes place there during a thermal oxidation process, while the field oxide is formed, however, outside this region.

The "LOCOS process" outlined above is appropriate for this purpose.

What is important in this case is that the p/n junction (=lower body boundary) lies at a deeper level than the lower edge of the barrier layer. In FIGS. 5a-5d, this requirement is taken into account by the dimension XFB (XFB expediently corresponds to the production fluctuations in the corresponding process block).

C. In the lower part of the trench wall, the oxidation can then take place unimpeded, as described, so that the full thickness of the field oxide arises especially in XFB.

A (limited) oxidation occurs in the region Xsidewall, too, since the oxygen molecules readily diffuse under the barrier. The result here is an upwardly thinning oxide layer, whereby the field oxide base point is thus defined.

With the oxidation process, a region depleted of p-type doping arises near the trench wall in the zones XFB and Xsidewall on account of the "pile-up" effect already described. Consequently, the channel is shortened by the oxidation process to an extent such that the p/n junction, i.e. the lower end of the channel, coincides to the greatest possible extent with the field oxide base point or a fixed distance is provided (a repeated out-diffusion may additively take place in this stage or a later stage in order to finely align/minimize the distance XFB). As a result, a self-aligned position of the channel relative to the field oxide zone is thus created.

D. The gate electrode must now also be positioned with respect to the position of the two structures channel/field oxide such that the later overlap XGD is minimized. Essentially two methods are appropriate for this purpose based on the production sequence already described above:

1. The gate electrode and the underlying gate oxide are prescribed at the same time as the fabrication of the abovementioned oxidation barrier. The main steps for one possible production sequence, based on a LOCOS process, are outlined in FIGS. 6a-6c.

As already described, after trench etching, the trench is completely filled with a material that can be etched selectively with respect to silicon (e.g. oxide). Afterward, this filling is etched back down to the depth below the mesa level where the lower edge of the oxidation barrier is later intended to be situated. The gate oxide is then formed, above which a relatively thin layer of polysilicon (as later gate electrode) is deposited. Finally, the deposition of the barrier material ensues. A spacer is then formed with this triple layering "barrier-poly-gate oxide" (i.e. a plurality of etchings ensue, at least the etching of the barrier material having to proceed anisotropically). Finally, the filling that remained in the lower trench region is etched selectively with respect to the spacer.

Only the main steps are reproduced in this production sequence. However, any desired variations are conceivable. Particularly at the upper edge of the trench (=transition from mesa to trench), it may be necessary to take additional measures to protect the layering under the barrier material during the spacer etching or one of the subsequent (e.g. oxidation) steps.

The process result can also be achieved by means of varying process sequences. One example in this respect:

After trench etching, the entire trench can be designed from a "sandwich" comprising gate oxide, a thin poly layer (later gate poly) and the barrier material. The trench is filled hereupon e.g. with poly, which is etched back down to that point into the trench which is intended to form the lower boundary of the barrier material ("poly plug"). A spacer process is subsequently effected e.g. using the material TEOS. The poly plug is then etched selectively from the trench, and the barrier material is removed in the lower part of the trench (the upper part is protected by the TEOS spacer).

The result of this process sequence is accordingly the same as that illustrated in FIGS. 6a-6c.

2. A different method is indicated by FIG. 7.

The self-aligned process, "oxidation of the field dielectric/channel shortening", as described in A.-C., is carried out first of all in this case. The oxidation barrier is subsequently removed e.g. by means of a wet-chemical etching. The gate oxide can then be grown (if this step has not already been carried out before process block B; in this case, gate oxide would then be uncovered in the upper trench region after the removal of the oxidation barrier). This is followed by the conformal deposition of a thin poly layer (thickness less than step height which arises through oxidation of the field dielectric). By means of anisotropic etching, this then gives rise to a poly spacer on the trench wall top side, which is later put at gate potential, and (depending on trench width) a second poly spacer or a complete filling in the lower trench region, which is driven as source electrode. It is thus possible to construct two electrodes by means of a joint poly deposition.

In conclusion it is possible to summarize as follows:
methods for the self-aligned definition of the channel position (at least of the lower channel boundary) have not been known hitherto for trench components.
previous methods relating to the channel are restricted to aligning only a point of the channel, that is to say either the start or the end, relative to a structure, e.g. a surface step (example: body implantation using a poly edge as masking).
according to the invention, the channel end is defined by means of the pile-up effect of the body elements in oxide in order to achieve a minimization of the gate-drain capacitance (short switching time).
according to the invention, the alignment is achieved by virtue of the fact that the channel that has been preset (by diffusion) is shortened toward a fixed point.

LIST OF REFERENCE SYMBOLS 1 transistor
2 semiconductor zone
3 trench
4 field plate
5 gate electrode
6 gate oxide layer
7 field oxide layer
8 source zone
9 body zone
10 drain/drift zone
11 poly plug
12 metallization layer
13 insulation structure
14 filling material
15 oxidation barrier layer
16 junction
B width of the trench
U lower region of the trench
O upper region of the trench

The invention claimed is:

1. A method for producing a junction region of a power transistor, said junction region being provided between a trench and a semiconductor zone surrounding the trench, the method comprising:
 a) providing an oxidation barrier layer to an upper part of inner walls of the trench,
 b) producing using thermal oxidation a first oxide layer on a lower part of the inner walls, said lower part being substantially uncovered by the oxidation barrier layer, and
 c) after step b), doping a region within the semiconductor zone to at least partially form a component of the power transistor.

2. The method as claimed in claim 1, further comprising, prior to step b), performing an etching process on a lower portion of the trench.

3. The method as claimed in claim 1, wherein step a) further comprises providing a filling material in a lower portion of the trench;
 providing the oxidation barrier layer on the inner walls and a top side of the filling material,
 removing of a portion of the oxidation barrier layer which bears on the filling material using an anisotropic etching process, and
 removal of the filling material using a selective etching process.

4. The method as claimed in claim 1, wherein doping the region within the semiconductor zone includes doping with boron to produce a body zone of the trench power transistor.

5. The method as claimed in claim 1, further comprising providing at least one field plate that is at least partly enclosed by the first oxide layer within the trench.

6. The method as claimed in claim 1, wherein step a) further comprises
 filling the trench with a filling material that can be etched selectively with respect to a material of the semiconductor zone and a material of the oxidation barrier layer;
 etching-back the filling material down to a lower portion of the trench,
 providing the oxidation barrier layer on the inner walls and a top side of the filling material,
 removing of a portion of the oxidation barrier layer which bears on the filling material using an anisotropic etching process, and
 removal of the filling material using a selective etching process.

7. A method for producing a junction region between a trench and a semiconductor zone surrounding the trench in a power transistor, the method comprising:
 a) providing an oxidation barrier layer to an upper part of inner walls of the trench, and
 b) producing using thermal oxidation a first oxide layer on a lower part of the inner walls, said lower part being substantially uncovered by the oxidation barrier layer,
 c) prior to step b), doping a region within the semiconductor zone to at least partially form a component of the power transistor.

8. The method as claimed in claim 7, further comprising, after step b), doping a region within the semiconductor zone to at least partially form a component of the trench power transistor.

9. The method as claimed in claim 7, wherein the doped region comprises a body zone of the semiconductor component, and wherein step a) further comprises providing the oxidation barrier layer such that a vertical position of a lower end of the oxidation barrier layer is situated above a vertical position of a junction between the body zone and an underlying part of the semiconductor zone.

10. The method as claimed in claim 7, further comprising providing a second oxide layer and a conductor layer between the oxidation barrier layer and a portion of the inner walls of the trench that is opposite to the oxidation barrier layer.

11. The method as claimed in claim 7, wherein step a) further comprises
- filling the trench with a filling material that can be etched selectively with respect to a material of the semiconductor zone and a material of the oxidation barrier layer;
- etching-back the filling material down to a lower portion of the trench,
- providing the oxidation barrier layer on the inner walls and a top side of the filling material,
- removing of a portion of the oxidation barrier layer which bears on the filling material using an anisotropic etching process, and
- removal of the filling material using a selective etching process.

12. The method as claimed in claim 7, further comprising, prior to step b), performing an etching process on a lower portion of the trench.

13. The method as claimed in claim 7, wherein step a) further comprises providing a filling material in a lower portion of the trench;
- providing the oxidation barrier layer on the inner walls and a top side of the filling material,
- removing of a portion of the oxidation barrier layer which bears on the filling material using an anisotropic etching process, and
- removal of the filling material using a selective etching process.

14. The method as claimed in claim 7, further comprising providing at least one field plate that is at least partly enclosed by the first oxide layer within the trench.

15. A method for producing a junction region in a trench power transistor, the trench power transistor comprising a front side contact, a rear side contact, a semiconductor body disposed between the front side contact and rear side contact, and a plurality of trenches in the semiconductor body, the semiconductor body including a source zone, a body zone and a drift zone arranged between the trenches, the plurality of trenches further including gate electrodes, the trench power transistor arranged such that vertical current flows are produced between the front side contact and the rear side contact through the semiconductor body, the method comprising:
a) providing an oxidation barrier layer to an upper part of inner walls of a first trench of said plurality of trenches,
b) producing using thermal oxidation a first oxide layer on a lower part of the inner walls, said lower part being substantially uncovered by the oxidation barrier layer, and
c) after step b), doping a region within the semiconductor zone to at least partially form the body zone.

16. The method as claimed in claim 15, wherein step a) further comprises:
- providing a filling material in a lower portion of the first trench;
- providing the oxidation barrier layer on the inner walls and a top side of the filling material,
- removing of a portion of the oxidation barrier layer which bears on the filling material using an anisotropic etching process, and
- removal of the filling material using a selective etching process.

17. The method as claimed in claim 15, wherein, prior to step b), performing an etching process on a lower portion of the first trench.

18. A method for producing a junction region in a trench power transistor, the trench power transistor comprising a front side contact, a rear side contact, a semiconductor body disposed between the front side contact and rear side contact, and a plurality of trenches in the semiconductor body, the semiconductor body including a source zone, a body zone and a drift zone arranged between the trenches, the plurality of trenches further including gate electrodes, the trench power transistor arranged such that vertical current flows are produced between the front side contact and the rear side contact through the semiconductor body, the method comprising:
a) providing an oxidation barrier layer to an upper part of inner walls of a first trench of the plurality of trenches, and
b) producing using thermal oxidation a first oxide layer on a lower part of the inner walls, said lower part being substantially uncovered by the oxidation barrier layer, and
c) prior to step b), doping a region within the semiconductor zone to at least partially form the body zone.

19. The method as claimed in claim 18, wherein step a) further comprises:
- providing a filling material in a lower portion of the first trench;
- providing the oxidation barrier layer on the inner walls and a top side of the filling material,
- removing of a portion of the oxidation barrier layer which bears on the filling material using an anisotropic etching process, and
- removal of the filling material using a selective etching process.

* * * * *